United States Patent [19]
Ogino et al.

[11] Patent Number: 5,907,571
[45] Date of Patent: May 25, 1999

[54] SEMICONDUCTOR LASER DEVICE AND METHOD FOR MANUFACTURING THE SAME

[75] Inventors: Shinji Ogino; Shoji Kitamura; Hiromi Mojikawa; Yoichi Shindo, all of Kanagawa; Takao Suyama; Ken Komatsu, both of Saitama, all of Japan

[73] Assignee: Fuji Electric Co., Ltd., Japan

[21] Appl. No.: 08/858,547

[22] Filed: May 19, 1997

[30] Foreign Application Priority Data

May 22, 1996 [JP] Japan .................................. 8-126167

[51] Int. Cl.$^6$ ...................................................... H01S 3/04
[52] U.S. Cl. ................................................. 372/43; 372/36
[58] Field of Search .................................. 372/43, 45, 36; 357/17

[56] References Cited

U.S. PATENT DOCUMENTS

| | | | |
|---|---|---|---|
| 5,140,384 | 8/1992 | Tanaka | 357/17 |
| 5,226,052 | 7/1993 | Tanaka et al. | 372/36 |
| 5,245,620 | 9/1993 | Tanaka et al. | 372/36 |
| 5,327,443 | 7/1994 | Tanaka et al. | 372/36 |

*Primary Examiner*—Rodney Bovernick
*Assistant Examiner*—Yisun Song
*Attorney, Agent, or Firm*—Rossi & Associates

[57] ABSTRACT

A semiconductor laser device is provided which includes a laser diode chip mounted on a sub-mount, a monitor photo diode incorporated in the sub-mount, for monitoring a laser beam emitted by the laser diode chip, a metallic main plate mounting the laser diode chip and the monitor photo diode, an end-face breaking protective layer covering the laser diode chip and the sub-mount; and a seal resin in which the laser diode chip, the monitor photo diode, the end-face breaking preventive layer and at least a portion of the metallic main plate are sealed. In this semiconductor device, a space is provided at a portion of an interface between the end-face breaking preventive layer and the seal resin, which portion is adapted to be irradiated with a monitor laser beam emitted by the laser diode chip, with a light intensity that is not higher than a half of a peak value of the intensity of the monitor laser beam.

10 Claims, 5 Drawing Sheets

SEMICONDUCTOR LASER DEVICE AND METHOD FOR MANUFACTURING THE SAME

FIELD OF THE INVENTION

The present invention relates to a semiconductor laser device used for an optical disc device and the like, wherein a laser diode chip is sealed in a seal resin.

BACKGROUND OF THE INVENTION

FIG. 9 is a perspective view of a known resin-seal-type semiconductor laser device. In this laser device, a laser diode chip 1 is bonded to a sub-mount 2 (Si crystal) incorporating a photo diode 2p, which is in turn bonded to a main plate 3 formed integrally with a common post 3a. The laser diode chip 1 and the monitor photo diode 2p are respectively connected, through bonding wires 4, to two other posts 3b that are formed separately from the main plate 3. The main plate 3, common post 3a and posts 3b are cut and divided from a single lead frame. The laser diode chip 1 is covered with a translucent, end-face breaking preventive layer 5, and further sealed in a translucent seal resin 6. The main plate 3 and the posts 3a, 3b are fixed by the seal resin 6 at predetermined relative positions. The end-face breaking preventive layer 5 is provided for preventing the seal resin 6 located in the vicinity of a light-emitting end face of the laser diode chip 1 from being broken by a laser beam. The laser beam is emitted along a laser optical axis 1x in the form of an elliptic cone having an apex at the end face of the laser diode chip 1. The main plate 3 has fixed end portions 3s that protrude from the seal resin 6 to be fixed to jigs of an optical application apparatus in which the semiconductor laser device is mounted. The end portions of the posts 3a, 3b also protrude from the seal resin 6 to be connected by soldering to a lead that leads to a drive source of the laser diode chip 1 and a lead that leads to an optical output monitor circuit, respectively.

The end-face breaking preventive layer 5 is formed of silicon resin, for example. After liquid silicon is dropped so as to cover or coat the laser diode chip 1 and sub-mount 2, the liquid silicon is cured by heat in a furnace kept at 120° C. to 160° C.

Subsequently, the epoxy-based seal resin 6 is formed by injection molding conducted at 150° C. or higher. When the seal resin 6 is cooled to room temperature after the injection molding, tensile stresses are applied due to an adhesive force between the surface of the laser diode chip 1 and the surface of the seal resin 6, since the end-face breaking preventive layer 5 has a larger coefficient of thermal expansion than the seal resin 6. FIG. 10 is a cross sectional view of the known resin-seal-type semiconductor laser device. The plane of this cross section and those of cross sectional views which will be referred to are perpendicular to the main plate including the laser optical axis 1x. The end-face breaking preventive layer 5 has the largest volume behind the laser chip 1 and above the sub-mount 2. Since the adhesive force between the end-face breaking preventive layer 5 and the seal resin 6 varies from portion to portion, peeling 5a may occur between the preventive layer 5 and the seal resin 6 where the adhesive force is smaller than the cutting force of the preventive layer 5. Also, where the adhesive force is larger than the material strength of the end-face breaking preventive layer 5, a crack 5b may be formed in the preventive layer 5 at its portion located above the monitor photo diode chip 2 and having the maximum amount of volumetric shrinkage.

The semiconductor laser device is incorporated for use in various kinds of optical application apparatus for optical discs, such as a compact disc, a laser beam printer and the like. In order to obtain stable digital signals in such applications, the laser device is required to emit a laser beam whose light intensity is stabilized with high accuracy, with the position and direction of its light-emitting point being highly accurately controlled.

The laser diode chip is secured to the monitor photo diode chip having an upper face serving as a light-receiving surface, and the monitor photo diode chip is adapted to monitor a light emitted backward from the laser diode chip. The light-emitting end face of the laser chip has a laser-beam-emitting portion having a size of about 5 $\mu$m×1 $\mu$m. The emitted monitor laser beam radiates or spreads out such that the full width at half maximum of the laser light intensity distribution has a lateral angle of about 10 degrees (as measured in the direction of the plane of the main plate) and a vertical angle of about 40 degrees (as measured in the direction perpendicular to the plane of the main plate). If a local portion of the end-face breaking preventive layer 5 peels off or separates from the seal resin 6 as described above, this peeling portion is given a larger light reflectance than the other portion of the layer 5, and therefore intensely reflects the laser beam emitted by the laser chip. When the laser diode is caused to generate a predetermine level of output in the form of light, therefore, the monitor photo diode which receives the light emitted backward provides an increased monitor current value, and is thus unable to control the light emitted forward with high accuracy. If cracks are formed in the end-face breaking preventive layer, the amount of light that enters the photo diode may vary due to multiple scattering of the light at the cracks, or interception of the monitor laser beam by the cracks, with a result of variations in the monitor current of the photo diode.

SUMMARY OF THE INVENTION

It is therefore a first object of the present invention to provide a resin-seal-type semiconductor laser device wherein thermal stresses applied to an end-face breaking preventive layer during molding of a seal resin are reduced, so as to avoid peeling or separation between the end-face breaking preventive layer and the seal resin at their portions that are directly irradiated with a monitor laser beam, and also prevent cracks from being formed in the end-face preventive layer, thereby assuring stable electric and optical characteristics. It is a second object of the invention to provide a method for manufacturing such a semiconductor laser device.

To accomplish the above object, there is provided according to a first aspect of the present invention a semiconductor laser device comprising: a laser diode chip mounted on a sub-mount; a monitor photo diode incorporated in the sub-mount, for monitoring a laser beam emitted by the laser diode chip; a metallic main plate mounting the laser chip and the monitor photo diode; an end-face breaking protective layer covering the laser diode chip and said sub-mount; and a seal resin in which the laser diode chip, the monitor photo diode, the end-face breaking preventive layer and at least a portion of the metallic main plate are sealed; wherein a space is provided at a portion of an interface between the end-face breaking preventive layer and the seal resin, which portion is adapted to be irradiated with a monitor laser beam emitted by the laser diode chip, with a light intensity that is not higher than a half of a peak value of the intensity of the monitor laser beam.

According to a second aspect of the present invention, there is provided a semiconductor laser device comprising:

a laser diode chip mounted on a sub-mount; a monitor photo diode incorporated in the sub-mount, for monitoring a laser beam emitted by the laser diode chip; a metallic main plate mounting the laser diode chip and the monitor photo diode; an end face breaking protective layer covering the laser diode chip and the sub-mount; and a seal resin in which the laser diode chip, the monitor photo diode, the end-face breaking preventive layer and at least a portion of the metallic main plate are sealed; wherein an interface between the end-face breaking preventive layer and the resin seal includes a non-adhering portion at which the end-face breaking preventive layer contacts with but does not adhere to the seal resin, the non-adhering portion being located at a portion of the interface that is adapted to be irradiated with a monitor laser beam emitted by the laser diode chip, with a light intensity that is not higher than a half of a peak value of the intensity of the monitor laser bean.

According to a third aspect of the present invention, there is provided a semiconductor laser device comprising; a laser diode chip mounted on a sub-mount; a monitor photo diode incorporated in the sub-mount, for monitoring a laser beam emitted by the laser diode chip; a metallic main plate mounting the laser diode chip and the monitor photo diode; an end face breaking protective layer covering the laser diode chip and the sub-mount; and a seal resin in which the laser diode chip, the monitor photo diode, the end-face breaking preventive layer and at least a portion of the metallic main plate are sealed; wherein a cut is formed in a portion of an interface between the end-face breaking preventive layer and the seal resin which is adapted to be irradiated with a monitor laser beam emitted by the laser diode chip, with a light intensity that is not higher than a half of a peak value of the intensity of the monitor laser beam, the cut extending from a surface of the end-face breaking preventive layer to an interior thereof.

Preferably, the above-indicated space is a through hole that extends from a surface of the end-face breakage preventive layer to an outer surface of the seal resin.

Preferably, the through hole is formed by a pin provided in a metallic mold for molding the seal resin.

Preferably, a distal end portion of the pin that contacts with the end-face breaking preventive layer is spaced apart from a bonding wire coupled to the sub-mount.

Preferably, a surface of the main plate remote from the sub-mount is supported by a support, during molding of the seal resin using the metallic mold.

Preferably, the above-indicated non-adhering portion of the end-face breaking preventive layer is formed by pressing a searing iron against a predetermined portion of a surface of the end-face breaking preventive layer before the preventive layer is sealed by the seal resin.

Preferably, the above-indicated cut is formed with a knife through the surface of the end-face breaking preventive layer.

In any aspect of the present invention as described above, the end-face breaking preventive layer includes a movable portion that can freely move without adhering to the seal resin. This movable portion absorbs strains arising at a boundary between two different resin layers and its surrounding portions due to a difference in the coefficient of thermal expansion between these two resin layers, and thermal stresses applied to a contact portion of the two resin layers are accordingly reduced. In the contact portion of the two resin layers, therefore, no cracks are formed in the end-face breaking preventive layer, and no clearance appears between the preventive layer and the seal resin, whereby a laser beam reflected by this contact portion is not disturbed by such cracks or clearance. Further, since the movable portion is formed in a portion which is irradiated with the laser beam with an intensity that is less than a half of its peak value, the light reflected by the movable portion and received by the photo diode, which may include disturbance due to the movable portion, has only a small intensity, resulting in a small variation in the intensity of the whole light incident upon the photo diode. Thus, the monitor current provided by the photo diode can be stabilized with respect to the ambient temperature.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 1:
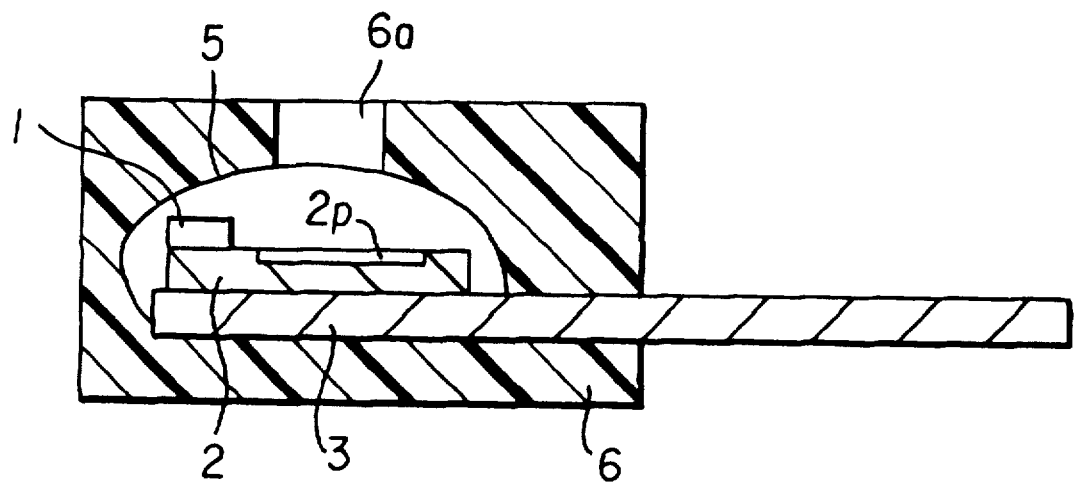
FIG. 1 is a perspective view of a semiconductor laser device according to one embodiment of the present invention.

FIG. 1 shows a cross sectional view of a semiconductor laser device constructed according to one embodiment of the present invention. In the following description, only differences between this embodiment and the known laser device will be explained. The end-face breaking preventive layer 5 is formed of silicon resin, with a thickness of about 300 μm as measured from the surface of the main plate 3, and is surrounded by the seal resin 6 for sealing the preventive layer 5. The seal resin 6 may be suitably formed of epoxy resin or acrylic resin having a high light transmittance. In this embodiment, the epoxy resin is used for the seal resin 6. A through hole 6a is formed through the seal resin 6 so as to extend from the surface of the end-face breaking preventive layer 5 to the outer surface of the seal resin 6. An opening of the through hole 6a which is open on the surface of the preventive layer 5 is located at a portion of the interface between the preventive layer 5 and the seal resin 6, which is to be irradiated with a monitor laser beam whose intensity is less than a half of its peak value. With the through hole 6a thus formed, the area of the preventive layer 5 that adheres to the seal resin 6 is reduced by an area corresponding to the cross-sectional area of the through hole 6a. Thus, even if the end-face breaking preventive layer 5 contracts or shrinks after molding of the seal resin, a tensile force applied to the preventive layer 5 is reduced due to the reduction of the contact area with the seal resin 6, and tensile stresses arising in the preventive layer 5 are accordingly reduced. Although the portion of the surface of the preventive layer 5 located in the opening of the through hole 6a is slightly shifted when the ambient temperature of the semiconductor laser device varies during use, the monitor laser beam reflected by this portion of the preventive layer 5 has only a small influence on the monitor photo diode 2p, thereby allowing the photo diode 2p to provide monitor current that is stable with respect to the ambient temperature.

Figure 2:
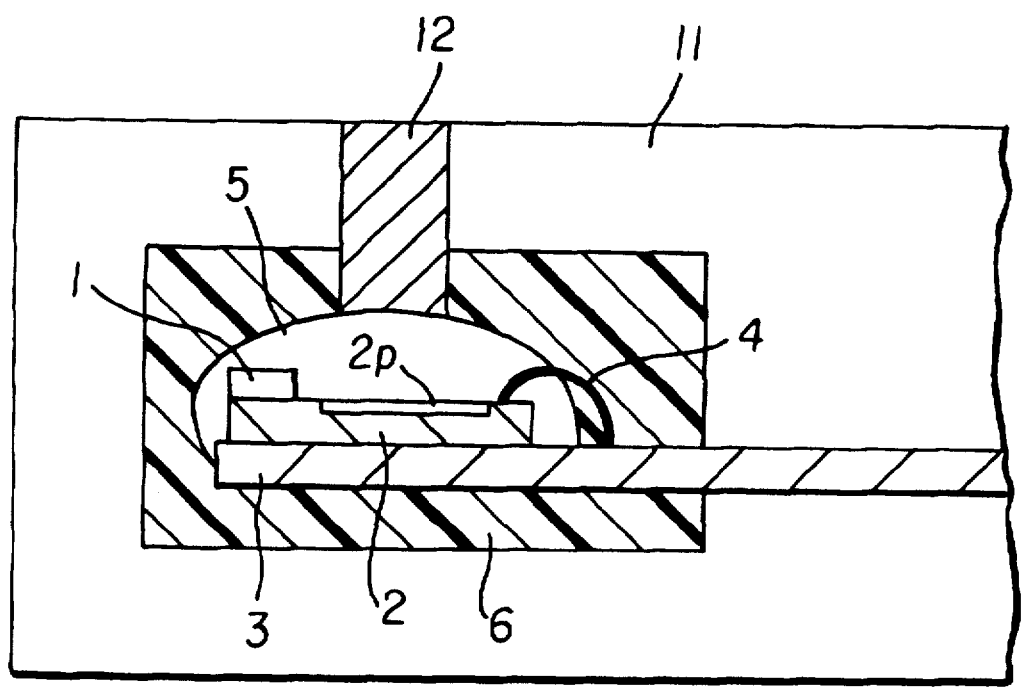
FIG. 2 is a cross sectional view showing the semiconductor laser device of the invention during injection molding.

One method of forming the through hole will be next explained. FIG. 2 is a cross sectional view of the semiconductor laser device according to the present invention, which is subjected to injection molding. The seal resin 6 having a through hole is formed in a metallic mold 11 provided with a pin 12 during the injection molding of the seal resin 6. The pin 12 of the metallic mold 11 is pressed against the end-face breaking preventive layer 5, to form an about 40 $\mu$m recess in the preventive layer 5, so that the resin injected at a pressure of 30–50N/cm$^2$ into the metallic mold 11 does not flow into the interface between the pin 12 and the preventive layer 5. The pin 12 is movable within the metallic mold 11, and the depth of the recess formed by the pin 12 can be adjusted even if the thickness of the preventive layer 5 varies. The silicon resin used for forming the end-face breaking preventive layer 5 is a soft, rubber-like material, and will not be broken or damaged when it is pressed to a depth of 40 $\mu$m by the pin 12. The preventive layer 5 resumes its original shape once the pin is removed after the molding.

Figure 3:
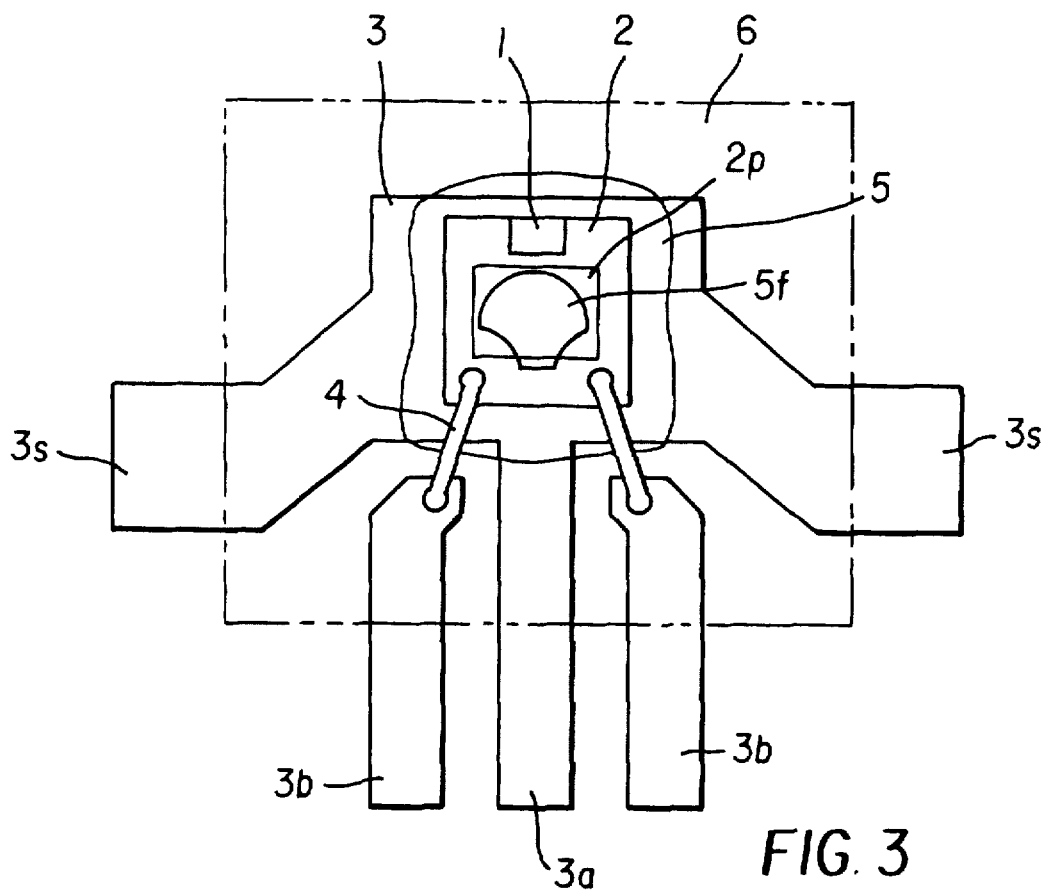
FIG. 3 is a top plan view showing a semiconductor laser device of another embodiment of the present invention.

If the pin 12 for forming the through hole 6a is pressed against a portion of the end-face breaking preventive layer 5 located right above the bonding wires 4 provided on the sub-mount 2, the bonding wires 4 may be pressed down or squashed, thereby causing a problem such as disconnection or short-circuiting. The structure for avoiding such a problem will be next described. FIG. 3 is a top plan view showing another embodiment of the semiconductor laser device of the present invention as viewed from the above. A through hole is formed above the light-receiving portion of the monitor photo diode 2p, and the distal end portion of the pin (or opening 5f of the through hole), which is located above the light-receiving surface of the photo diode 2, has a polygonal or curved shape so as not to extend over vertically upper portions of the bonding wires 4. In this arrangement, disconnection or short-circuiting of the bonding wires 4 does not occur even if the pin is pressed more or less strongly against the end-face breaking preventive layer 5.

Figure 4:
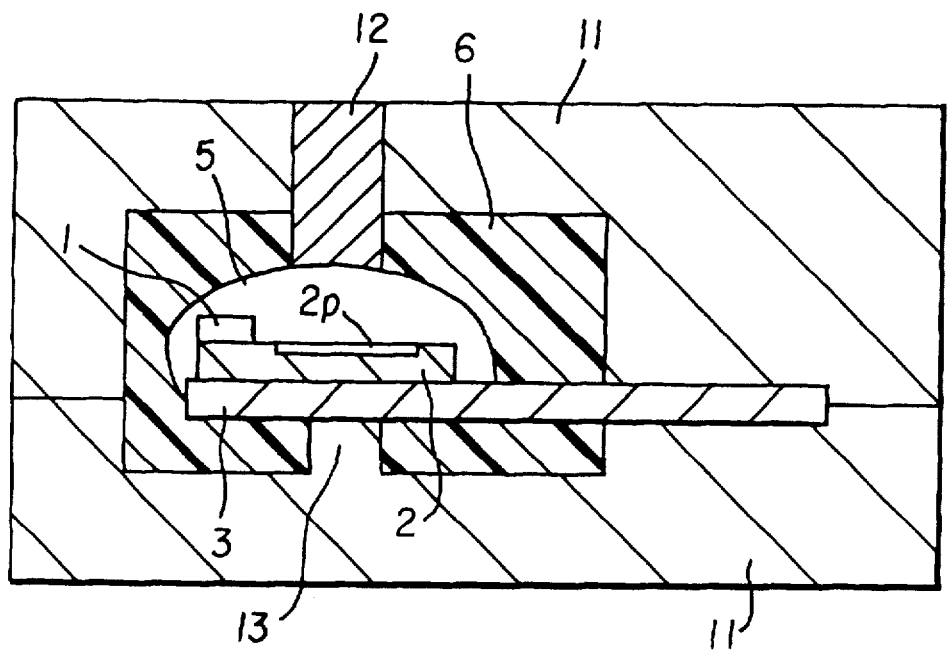
FIG. 4 is a cross sectional view showing a semiconductor laser device during injection molding according to a further embodiment of the invention.

In the first embodiment as described above, the silicon resin of the end-face breaking preventive layer is pressed from above by the pin during injection molding of the seal resin. As a result, the main plate of the lead frame may be deflected or bent, and the position of the laser diode chip, or the optical axis of the laser beam, may be shifted. The structure aimed at avoiding this problem will be next described. FIG. 4 is a cross sectional view of another embodiment of the semiconductor laser device of the present invention. In this embodiment, a metallic rear pin 13 for supporting the rear surface of the main plate 3 (which has not been cut from the lead frame) is formed integrally with the metallic mold 11. Since the injection molding of the seal resin 6 is conducted while the main plate 3 is supported at its rear surface by the pin 13, the main plate 3 is prevented from being deformed when the end-face breaking preventive layer 5 is pushed down by the pin 12 during the injection molding, thus causing no shifting of the optical axis of the laser beam.

The metallic rear pin may be replaced by a resin rod having the same shape. In this case, the resin rod provides a part of the seal resin.

Figure 5A:
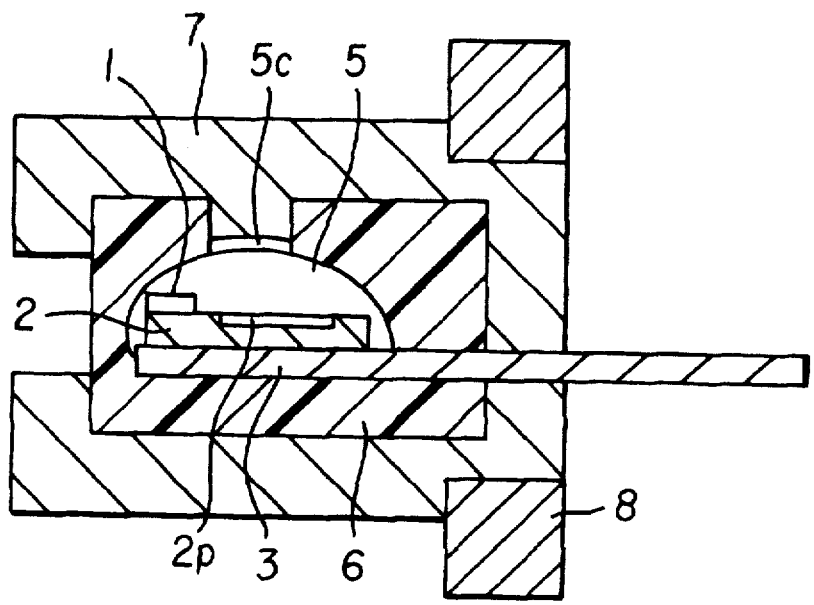
FIG. 5(a) is a cross sectional view showing a semiconductor laser device provided with a secondary seal resin according to the present invention, wherein the rear surface of a main plate is not supported during injection molding.
Figure 5B:
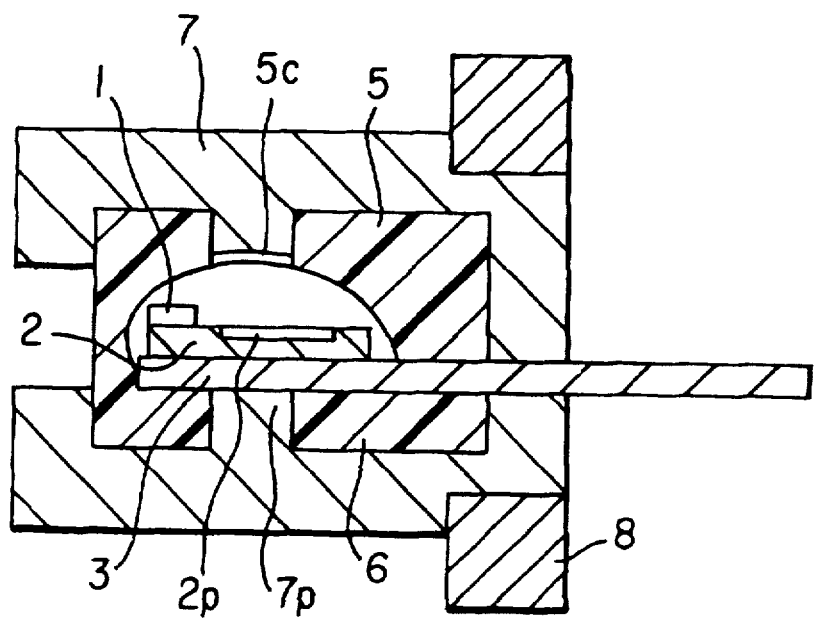
FIG. 5(b) is a cross sectional view showing a semiconductor device provided with a secondary seal resin, wherein the rear surface of the main plate is supported by a pin during injection molding.

FIGS. 5(a) and 5(b) are cross sectional views of semiconductor laser devices according to the present invention, each of which is provided with a secondary seal resin 7, wherein FIG. 5(a) shows the case where a rear support is not provided for supporting the rear surface of the main plate 3, and FIG. 5(b) shows the case where such a rear support is provided. The present invention may be applied to the semiconductor laser device in which an adapter ring 8 is attached to the fixed end portions 3s of the main plate 3 after molding of the seal resin 6, and a secondary seal resin 7 is integrally formed around the seal resin 6 to provide an additional seal. The secondary seal resin 7 is formed of epoxy-based resin used for sealing semiconductor chips. Although a part of the secondary seal resin 7 enters the through hole 6a of the seal resin 6, the secondary seal resin, which includes a large amount of mold release agent, does not have wettability with the end-face breaking preventive layer 5, whereby the secondary seal resin 7 and the preventive layer 5 repel each other and do not adhere to each other. Further, since the end-face breaking preventive layer 5 undergoes larger heat contraction than the secondary seal resin 7, a clearance 5c appears between the preventive layer 5 and the seal resin 7 after cooling. Thus, in the semiconductor laser device provided with the secondary seal resin, a portion of the end-face breaking preventive layer 5 does not adhere to anything to be free to expand or contract, as in the first embodiment, and therefore the effect of reduced thermal stresses can be obtained.

The thermal stresses arising upon molding the seal resin can be also reduced by modifying the surface of the end-face breaking preventive layer 5 to thereby reduce the adhesion between the preventive layer 5 and the seal resin 6.

Figure 6:
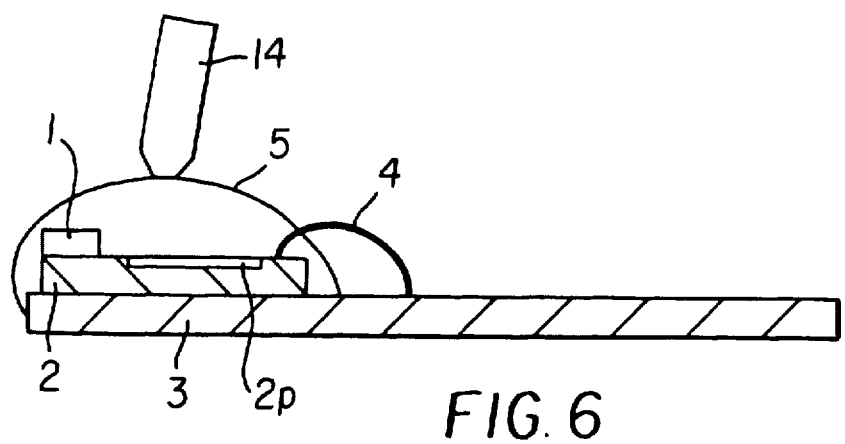
FIG. 6 is a cross sectional view showing the process step of modifying the surface of an end-face breaking preventive layer according to the present invention.

FIG. 6 is a cross sectional view showing a process step of modifying the surface of the preventive layer 5 according to another embodiment of the invention. In this step, a searing iron 14, such as a metallic wire or rod heated to about 300° C., is pressed against the preventive layer 5, so as to heat-treat a part of the surface of the preventive layer 5. Thereafter, the seal resin 6 is formed around the preventive layer 5 for sealing in the same manner as in the first embodiment.

Figure 7:
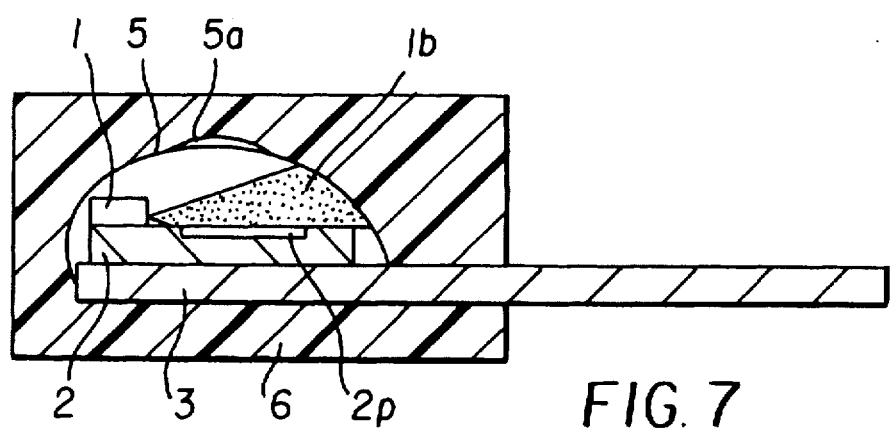
FIG. 7 is a cross sectional view showing a semiconductor laser device according to another embodiment of the invention, wherein the surface of the end-face breaking preventive layer is modified.

FIG. 7 is a cross sectional view showing the semiconductor laser device obtained by modifying the surface of the end-face breaking preventive layer 5 according to the present invention. In this laser device, only a local portion of the preventive layer 5 which has been heat-treated does not adhere to the seal resin 6, and therefore a peel portion 5a having a length of about 50 $\mu$m appears due to a difference in the coefficient of linear expansion between the preventive layer 5 and the seal resin 6, which causes the preventive layer 5 to shrink to a greater extent when cooled from the temperature of 160° C. upon the injection molding down to room temperature. Thus, the thermal shrinkage stresses are absorbed at the peel portion 5a. Since a portion of the surface of the preventive layer 5 which is to be irradiated with the monitor laser beam 1b emitted by the laser chip 1 is not subjected to heat treatment, and therefore does not peel off from the seal resin 6, this portion of the layer 5 provides a stable reflectance with respect to the laser beam emitted by the laser diode chip 1, and the quantity of light monitored by the photo diode 2p and the monitor current generated by the photo diode 2p are not influenced by the ambient temperature. Thus, the present laser device exhibits stable electric and optical characteristics.

Needless to say, a secondary seal may be provided using epoxy resin generally used for sealing semiconductors, after the end-face breaking preventive layer is heat-treated with the searing iron and sealed with the seal resin.

Figure 8:
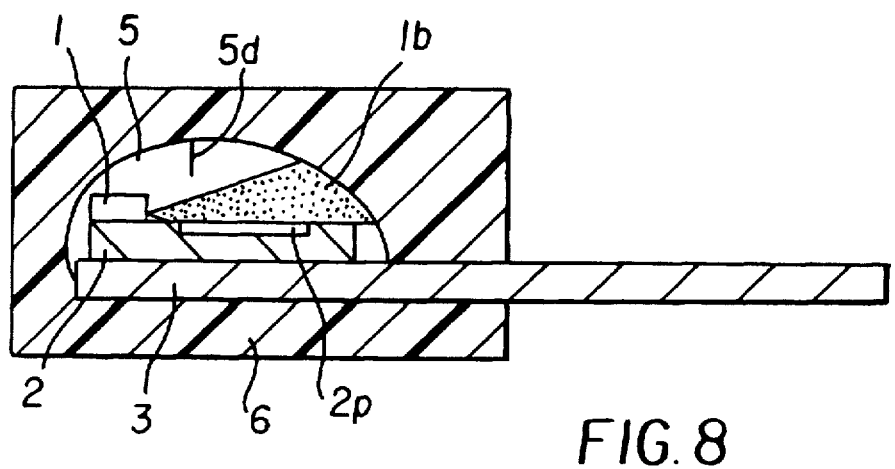
FIG. 8 is a cross sectional view showing a semiconductor laser device in which a cut is formed in an end-face breaking preventive layer.
Figure 9:
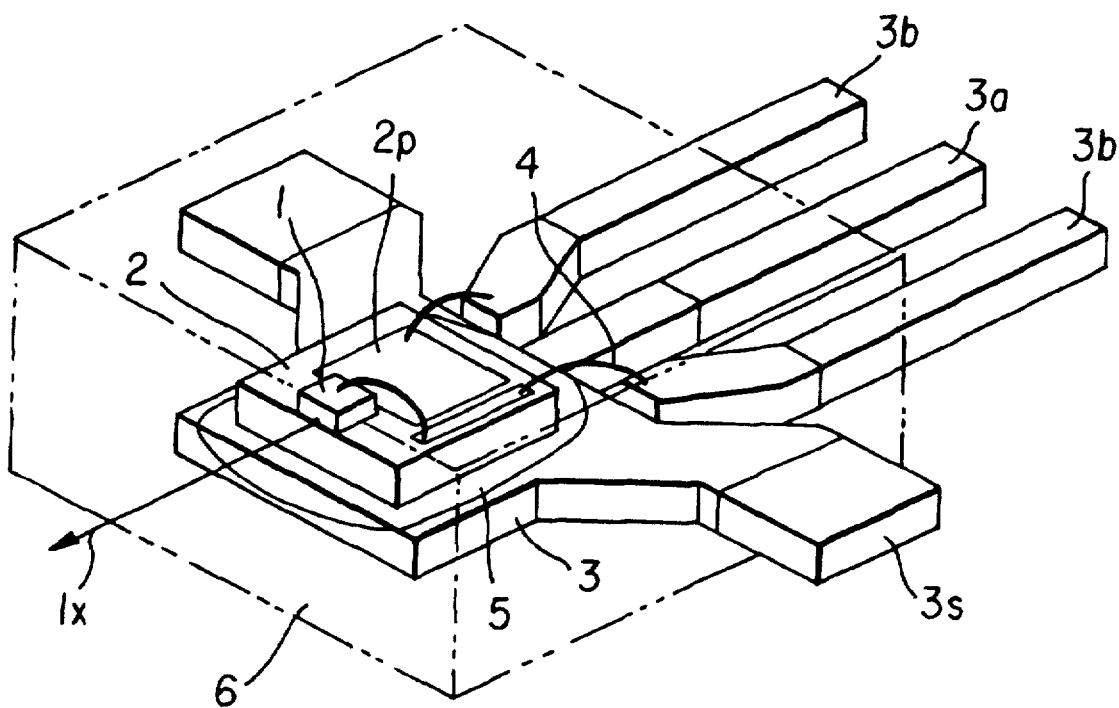
FIG. 9 is a perspective view showing a known resin-seal-type semiconductor laser device.
Figure 10:
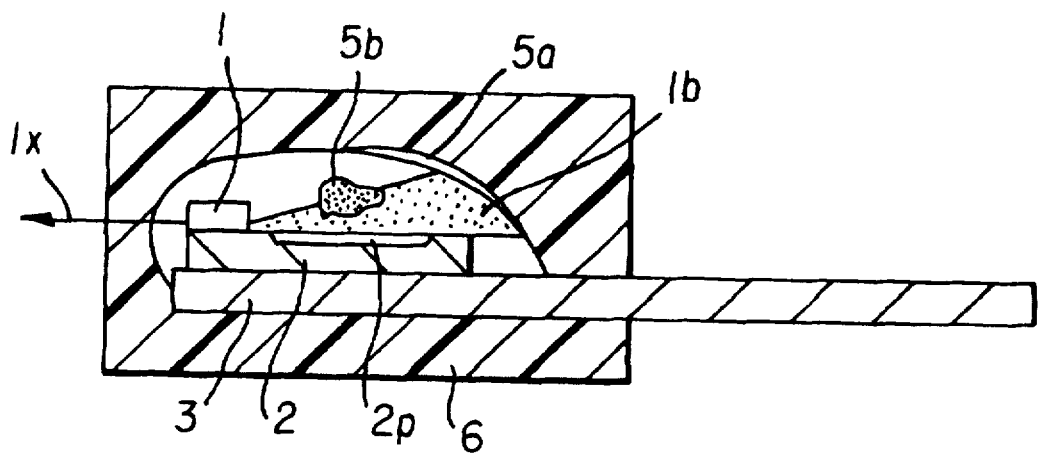
FIG. 10 is a cross sectional view of the known resin-seal-type semiconductor laser device.

FIG. 8 is a cross sectional view of a semiconductor laser device according to the present invention, wherein a cut is formed in the end-face breaking preventive layer 5 so as to dissipate stresses applied to the layer 5. To produce this laser device, a thin knife edge is inserted into a portion of the surface of the end-face breaking preventive layer 5 located behind the laser chip 1, so as to form a cut 5b in the preventive layer 5, and then the seal resin 6 is formed by injection molding. Although the preventive layer 5 normally tends to shrink upon cooling after the injection molding, the interface of the end-face breaking preventive layer 5 with the seal resin 6 is divided at the cut 5b into two parts in the direction perpendicular to the cut 5b, whereby the volume of the preventive layer 5 is reduced, resulting in reduced thermal stresses arising upon cooling. Further, the cut 5b thus formed absorbs tensile stresses arising between the end-face breaking preventive layer 5 and the seal resin 6, thereby to reduce thermal stresses arising in the end-face breaking preventive layer 5. The depth of the cut 5b is controlled so as not to intercept the laser beam 1 which is emitted from the back face of the laser chip 1 to spread out at an angle of about 20 degrees as measured in the vertical direction with respect to the horizontal line.

Needless to say, a secondary seal may be provided using epoxy resin generally used for sealing semiconductors, after the cut is formed with a knife in the end-face breaking preventive layer and sealed with the seal resin.

According to the present invention, in the semiconductor laser device in which the laser diode chip is fixedly mounted on the metallic main plate through the sub-mount incorporating the monitor photo diode, and is covered with the end face breaking protective layer for preventing the seal resin in the vicinity of the light-emitting end face of the laser diode chip from being broken or damaged by a laser beam, and in which the laser diode chip, sub-mount, end-face breaking preventive layer and main plate are sealed in the seal resin, the through hole extending from the surface of the end-face breaking preventive layer to the outer surface of the seal resin is provided in the seal resin. In other forms of the invention, a portion of the surface of the end-face breaking preventive layer which is to be irradiated with a laser beam whose intensity is only a half of its peak value may be modified, to reduce adhesion of this portion to the seal resin, or a cut may be formed in this portion of the preventive layer, so that the preventive layer is provided with a freely movable portion that does not adhere to the seal resin. In this arrangement, the freely movable portion absorbs strains arising in a contact portion of two different resin layers surrounding the movable portion due to a difference in the coefficient of thermal expansion between these two resin layers, and thermal stresses applied to the contact portion of the two resin layers are thus reduced. In the contact portion of the two resin layers, therefore, no cracks are formed in the preventive layer, and no clearance appears between the preventive layer and the seal resin, whereby a laser beam reflected by this contact portion is not disturbed by such cracks or clearance. Further, since the freely movable portion is formed in a portion which is irradiated with the laser beam with an intensity that is less than a half of its peak value, the light reflected by the movable portion and received by the photo diode, which may include disturbance due to the movable portion, has only a small intensity, resulting in a small variation in the intensity of the whole light incident upon the photo diode. Thus, the monitor current provided by the photo diode can be stabilized with respect to the ambient temperature.

Further, according to the present invention, the through hole for reducing thermal stresses may be formed in the seal resin using an appropriate metallic mold, or the surface of the end-face breaking preventive layer may be modified by means of a searing iron, or the cut may be formed by inserting a knife edge into the preventive layer. Thus, the formation of the through hole, surface modification, and formation of the cut may be achieved by a relatively simple apparatus, assuring a high yield in the production of the laser device, while assuring high stability in the monitor current.

What is claimed is:

1. A semiconductor laser device comprising:

a laser diode chip mounted on a sub-mount;

a monitor photo diode incorporated in said sub-mount, for monitoring a laser beam emitted by said laser diode chip;

a metallic main plate mounting said laser diode chip and said monitor photo diode;

an end-face breaking preventive layer covering said laser diode chip and said sub-mount; and a seal resin in which said laser diode chip, said monitor photo diode, said end-face breaking preventive layer and at least a portion of said metallic main plate are sealed; wherein a space is provided at a portion of an interface between said end-face breaking preventive layer and said seal resin, which portion is adapted to be irradiated with a monitor laser beam emitted by said laser diode chip, with a light intensity that is not higher than a half of a peak value of the intensity of the monitor laser beam.

2. A semiconductor laser device comprising;

a laser diode chip mounted on a sub-mount;

a monitor photo diode incorporated in said sub-mount, for monitoring a laser beam emitted by said laser diode chip;

a metallic main plate mounting said laser diode chip and said monitor photo diode;

an end face breaking preventive layer covering said laser diode chip and said sub-mount; and a seal resin in which said laser diode chip, said monitor photo diode, said end-face breaking preventive layer and at least a portion of said metallic main plate are sealed; wherein an interface between said end-face breaking preventive layer and said seal resin includes a non-adhering portion at which the end-face breaking preventive layer contacts with but does not adhere to the seal resin, said non-adhering portion being located at a portion of said interface that is adapted to be irradiated with a monitor laser beam emitted by said laser diode chip, with a light intensity that is not higher than a half of a peak value of the intensity of the monitor laser beam.

3. A semiconductor laser device comprising;

a laser diode chip mounted on a sub-mount;

a monitor photo diode incorporated in said sub-mount, for monitoring a laser beam emitted by said laser diode chip;

a metallic main plate mounting said laser diode chip and said monitor photo diode;

an end face breaking preventive layer covering said laser diode chip and said sub-mount; and a seal resin in which said laser diode chip, said monitor photo diode, said end-face breaking preventive layer and at least a portion of said metallic main plate are sealed; wherein a cut is formed in a portion of an interface between said end-face breaking preventive layer and said seal resin which is adapted to be irradiated with a monitor laser beam emitted by said laser diode chip, with a light intensity that is not higher than a half of a peak value of the intensity of the monitor laser beam, said cut extending from a surface of said end-face breaking preventive layer to an interior thereof.

4. A semiconductor laser device according to claim 1, wherein said space is a through hole which extends from a surface of said end-face breakage preventive layer to an outer surface of said seal resin.

5. A method for manufacturing a semiconductor laser device comprising the steps of:

mounting a laser diode chip on a sub-mount incorporating a monitor photo diode;

mounting said laser diode chip and said monitor photo diode on a metallic main plate;

covering at least said laser diode chip and said sub-mount with an end-face breaking preventive layer; and sealing said laser diode chip, said monitor photo diode, said end-face breaking preventive layer and at least a portion of said metallic main plate in a seal resin, such that a through hole is provided at a portion of an interface between said end-face breaking preventive layer and said seal resin, which portion is adapted to be irradiated with a monitor laser beam emitted by said laser diode chip, with a light intensity that is not higher than a half of a peak value of the intensity of the monitor laser beam; wherein said through-hole is formed by a pin provided in a metallic mold for molding said seal resin.

6. A method for manufacturing a semiconductor laser device according to claim 5, wherein a distal end portion of said pin that contacts with said end-face breaking preventive layer is spaced apart from a bonding wire coupled to said sub-mount.

7. A method for manufacturing a semiconductor laser device according to claim 5, wherein a surface of said main plate remote from said sub-mount is supported by a support, during molding of said seal resin using said metallic mold.

8. A method for manufacturing a semiconductor laser device according to claim 6, wherein a surface of said main plate remote from said sub-mount is supported by a support, during molding of said seal resin using said metallic mold.

9. A method for manufacturing a semiconductor laser device comprising the steps of:

mounting a laser diode chip on a sub-mount incorporating a monitor photo diode;

mounting said laser diode chip and said monitor photo diode on a metallic main plate;

covering at least said laser diode chip and said sub-mount with an end-face breaking preventive layer; and sealing said laser diode chip, said monitor photo diode, said end-face breaking preventive layer and at least a portion of said metallic main plate in a seal resin, such that an interface between said end-face breaking preventive layer and said seal resin includes a non-adhering portion at which the end-face breaking preventive layer contacts with but does not adhere to the seal resin, said non-adhering portion being located at a portion of said interface that is adapted to be irradiated with a monitor laser beam emitted by said laser diode chip, with a light intensity that is not higher than a half of a peak value of the intensity of the monitor laser beam; wherein said non-adhering portion of said end-face breaking preventive layer is formed by pressing a searing iron against a predetermined portion of a surface of the end-face breaking preventive layer before the preventive layer is sealed.

10. A method for manufacturing a semiconductor laser device comprising the steps of:

mounting a laser diode chip on a sub-mount incorporating a monitor photo diode;

mounting said laser diode chip and said monitor photo diode on a metallic main plate;

covering at least said laser diode chip and said sub-mount with an end-face breaking preventive layer; and sealing said laser diode chip, said monitor photo diode, said end-face breaking preventive layer and at least a portion of said metallic main plate in a seal resin, such that a cut is formed in a portion of an interface between said end-face breaking preventive layer and said seal resin which is adapted to be irradiated with a monitor laser beam emitted by said laser diode chip, with a light intensity that is not higher than a half of a peak value of the intensity of the monitor laser beam, said cut extending from a surface of said end-face breaking preventive layer to an interior thereof.

* * * * *